United States Patent
Bombard

(10) Patent No.: US 6,760,674 B2
(45) Date of Patent: Jul. 6, 2004

(54) AUDIO SPECTRUM ANALYZER IMPLEMENTED WITH A MINIMUM NUMBER OF MULTIPLY OPERATIONS

(75) Inventor: Thomas J. Bombard, Marlborough, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 362 days.

(21) Appl. No.: 09/972,558

(22) Filed: Oct. 8, 2001

(65) Prior Publication Data

US 2003/0179820 A1 Sep. 25, 2003

(51) Int. Cl.[7] ............................................. G01R 23/00
(52) U.S. Cl. ...................................... 702/76; 324/76.19
(58) Field of Search .............................. 702/76, 32, 48, 702/54, 56, 57, 75, 77, 103, 190, 194; 381/98; 324/76.11–12, 76.19–22; 375/130, 224, 225, 353, 355

(56) References Cited

U.S. PATENT DOCUMENTS 3,686,490 A * 8/1972 Goldstone .................... 708/403
5,138,662 A * 8/1992 Amano et al. ............... 704/219
6,608,874 B1 * 8/2003 Beidas et al. ................ 375/353

* cited by examiner

Primary Examiner—Marc S. Hoff
Assistant Examiner—Edward Raymond
(74) Attorney, Agent, or Firm—Baker Botts L.L.P.

(57) ABSTRACT

A spectrum analyzer that may be implemented by a simple microcontroller that does not have a hardware multiply function is disclosed. The spectrum analyzer of the present invention utilizes at least five frequency bins. The input signal is sampled at four times the bin frequency. The input signal is sampled at twice the Nyquist rate, which results in symmetries in the sin(wn) and cos(wn) functions. These symmetries allow the in-phase and quadrature components of the input signal to be calculated by add, ignore or subtract operations instead of the more complex multiplication and integration operations. Accordingly, the energy for each bin may be calculated with a minimum number of multiply operations. Because the number of multiply operations have been significantly reduced, these multiply operations may be performed by software instead of hardware. As a result, the spectrum analyzer may be implemented with a simple processor that does not have a hardware multiply. Another frequency bin is added by oversampling the highest frequency. A low pass filter is used to eliminate the effect of aliasing on the other frequency bins. A simple processor can still handle a bin that has been processed in this manner. As a result, at least five frequency bins may be processed by a spectrum analyzer implemented on a simple processor.

22 Claims, 9 Drawing Sheets

AUDIO SPECTRUM ANALYZER IMPLEMENTED WITH A MINIMUM NUMBER OF MULTIPLY OPERATIONS

FIELD OF THE INVENTION

The present application is related to audio spectrum analyzers. More specifically, the present application is related to system and method for an audio spectrum analyzer.

BACKGROUND OF THE INVENTION TECHNOLOGY

A spectrum analyzer is an instrument for measuring the amplitudes of the components of a complex waveform throughout the frequency range of the waveform. Audio spectrum analyzers are used for analysis of audio waveforms or signals over a specified frequency range. Typically, this frequency range is 20 Hz to 20 kHz, which is the range of audible signals. Generally, audio spectrum analyzers output or display a graph of the frequency content of an audio signal. For example, the output of an audio spectrum analyzer may be a standard X-Y spectrum plotting amplitude versus frequency or a 3-D wireframe that plots amplitude, time and frequency. Audio spectrum analyzers may be used for a variety of purposes, such as conducting sound level measurements for a given environment, measuring the performance of a musical instrument or loudspeaker system, and measuring the frequency response of an audio device such as a tape recorder.

Spectrum analyzers generally fall into two categories: swept spectrum analyzers and Fast Fourier Transform (FFT) based spectrum analyzers. Swept spectrum analyzers utilize one or more band pass filters in combination with a tunable mixer to measure the signal amplitude at a given frequency. By sweeping or changing the center frequency received, one may develop a plot of amplitude versus frequency for the signal. While swept spectrum analyzers are suitable for high frequency analysis, swept spectrum analyzers are not ideal for audio spectrum analysis because they are only capable of detecting continuous wave signals. As a result, FFT based spectrum analyzers are generally used for the analysis of audio signals.

A computer system or digital signal processor (DSP) utilizing the FFT typically digitizes the signal under analysis using an analog-to-digital (A/D) converter. The resulting digital signal is a set of digital values corresponding to the points sampled from the audio signal. The stored digital values are subsequently processed using the FFT algorithm. This method allows for the capture and analysis of short duration events. For example, FFT based audio spectrum analyzers may capture the spectrum of a single drum beat.

FFT based audio spectrum analyzers utilize Fourier transforms to analyze audio signals. The Fourier transform is based on the principal that any signal or waveform can be represented as a combination of sine waves of various frequencies. The Fourier transform involves splitting or decomposing a signal into these component frequencies or sine waves. Thus, any periodic function of time x(t) may be resolved into an equivalent infinite summation of sine waves and cosine waves with frequencies that start at zero and increase in integer multiples of a base frequency $f_0=1/T$, where T is the period of x(t). Accordingly, the periodic function x(t) may be expressed as a Fourier series:

$$x(t) = a_0 + \sum_{k=1}^{\infty} (a_k \cos(2\pi k f_0 t) + b_k \sin(2\pi k f_0 t))$$

The Fourier transform determines the values for the $a_k$ and $b_k$ coefficients necessary to produce a Fourier series and thereby translates a function in the time domain into a function in the frequency domain. As a result, the Fourier transform allows one to analyze a signal in the time domain for its frequency content because the Fourier coefficients of the transformed function correspond to the contribution of each sine and cosine function at each frequency.

However, computer systems cannot perform infinite summations and can only work with discrete data. Therefore, numerical computation of the Fourier transform of x(t) requires discrete sample values. The discrete Fourier transform (DFT) estimates the Fourier transform of a function from a finite number of sampled points. The sampled points are representative of the signal at all other times. Thus, the DFT computes a discrete numerical equivalent of the Fourier transform using sums instead of integrals. However, to approximate the function by samples, and to approximate the Fourier integral by the DFT, require applying a matrix whose order is the number of sample points n. As a result, the number of computations required to approximate the function and the Fourier integral is $n^2$ arithmetic operations. Thus, the number of computations required may become increasingly unmanageable as the number of samples increase. The FFT is an optimized DFT algorithm that reduces the number of computations from $n^2$ to $n \log n$ arithmetic operations. Computer systems utilizing the FFT can therefore incorporate more samples. The accuracy of the approximation increases with the number of sample points. Thus, the FFT is a popular algorithm for several applications, including audio spectrum analyzers.

As discussed above, computer systems or microcontrollers utilize the DFT and the FFT in order to approximate the Fourier transforms of time domain signals. The DFT and the FFT allow the computer system to approximate the Fourier transform from a discrete number of samples. However, both of these algorithms require the extensive use of the multiplication function because the DFT and the FFT involve a lot of multiplying and then accumulating the result. As discussed above, the DFT requires multiplying an n×n matrix by a vector, which requires $n^2$ arithmetic operations. While the FFT reduces the number of arithmetic operations required to approximate the Fourier transform, the FFT still requires the use of the multiply function. Therefore, the DFT and the FFT algorithms both require processors that can perform multiplication and additions in parallel. A microcontroller or processor requires additional hardware in order to perform the multiply function. As a result, simple processors without the hardware to perform multiplication operations cannot utilize the DFT or FFT and accordingly, cannot be used to implement an audio spectrum analyzer.

Furthermore, in order for a processor to perform either the DFT or the FFT, the processor must frame the data. The process of data framing involves acquiring a block of samples before any of the samples are processed. Thus, the processor must acquire a block of samples from the signal before it processes any of the samples. Accordingly, all the samples in the frame must be stored in memory before any of the samples are processed. As a result, valuable memory resources must be allocated to storing all of the samples in the frame.

SUMMARY OF THE INVENTION

The invention overcomes the above-identified problems as well as other shortcomings and deficiencies of existing technologies by providing a spectrum analyzer with a minimum number of multipliers. Therefore a spectrum analyzer according to the present invention may be implemented using a simple microcontroller that does not need a hardware multiply function.

Accordingly, an exemplary embodiment of the present invention performs a spectral analysis of an input signal comprising the steps of:

sampling the input signal four times a first frequency f1;
calculating the Spectral Energy at at least one frequency bin Fn, whereby Fn equals 1/(4n)f1 and n being an integer>=1.

Another frequency bin is added by sampling at 4 times the first frequency. A low pass filter is used to eliminate the effect of aliasing on the other frequency bins and to compensate the effect of the sampling at 2×f1.

Another exemplary embodiment produces a frequency spectrum analysis for an input signal comprises the steps of:

low pass filtering the input signal, whereby an attenuation of the input signal at a frequency f1 is achieved;
sampling the input signal eight times of the first frequency f1/2;
calculating the spectral energy at f1 for a first bin $F_1$;
discarding every other sample and calculating the spectral energy at at least one frequency bin Fn, whereby Fn equals 1/(4(n−1))f1 and n being an integer>=2.

Yet another exemplary embodiment provides a digital audio spectrum analyzer for analyzing an analog input signal which comprises:

a low pass filter receiving the analog input signal and attenuating the input signal at a frequency f1 and generating an output signal;
an analog-to-digital-converter receiving the output signal of the low pass filter and sampling a frequency f2=f1/2 at 8-times the frequency f1;
a sampling reducer generating a signal which is sampled at 4 times the frequency f1 coupled with the analog-to-digital-converter;
a first spectral energy calculation unit receiving the signal sampled at 4 times the frequency f1;
a second spectral energy calculation unit receiving the signal sampled at 8-times the frequency f1.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein.

Figure 1:
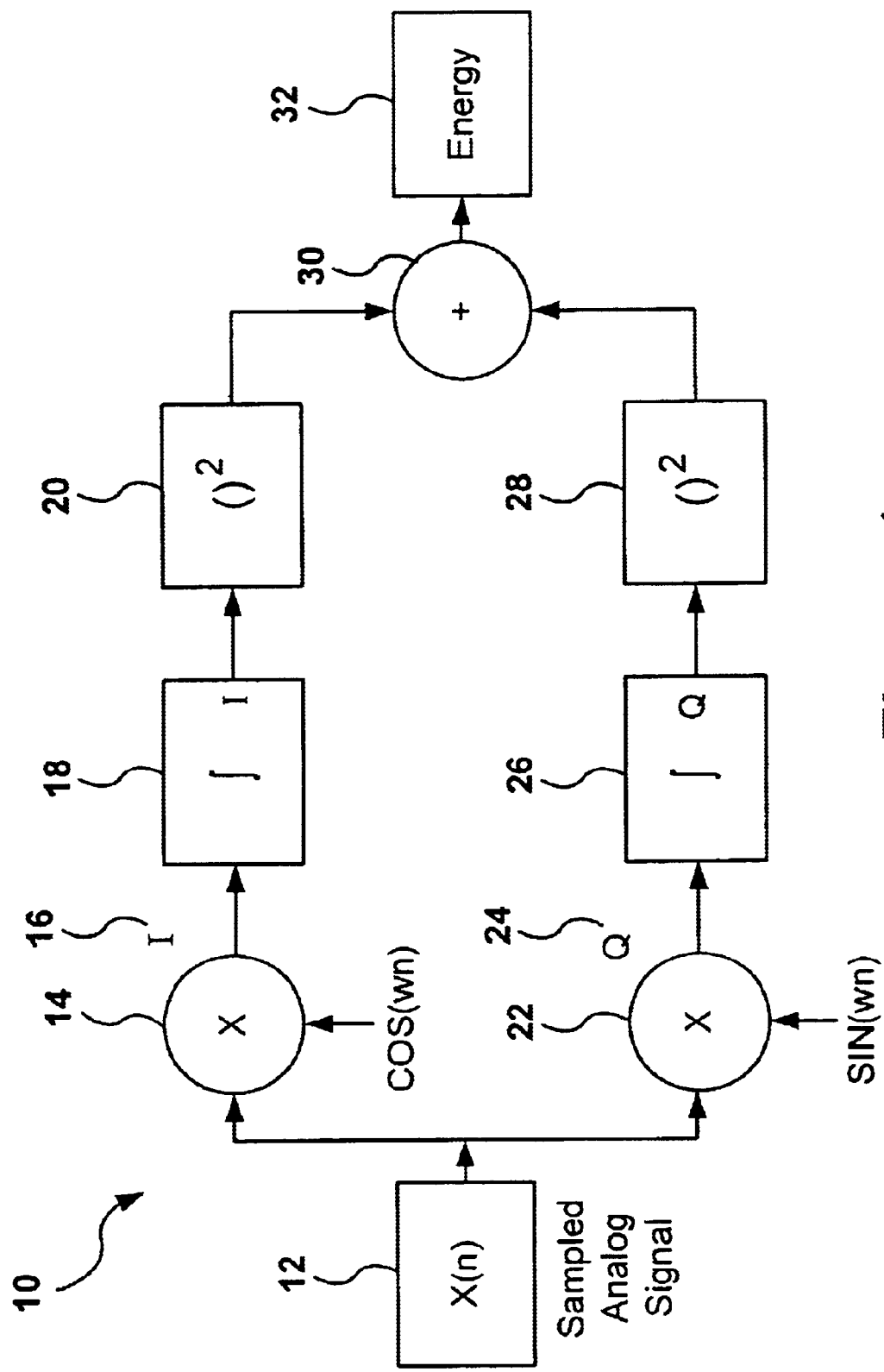
FIG. 1 is a flow chart of a spectrum analyzer.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENTS

The present invention is directed to a spectrum analyzer that is operable to output the energy in an input signal at a given set of frequencies using a minimum number of multiply operations. In addition to minimizing the number of multiply functions, the spectrum analyzer avoids the need to frame data. Usually, a FFT requires a lot of processing power as a FFT calculates a spectrum at discrete frequency bins. Therefore, digital signal processors are used to perform a FFT efficiently. However, the present invention enables an audio spectrum analyzer to be implemented with a low cost microcontroller, such as an 8-bit microcontroller, having limited RAM and no hardware multiply to perform the DFT and FFT operations necessary to determine a frequency spectrum of the energy in the input signal.

FIG. 1 illustrates a flowchart of a spectrum analyzer. The spectrum analyzer, indicated generally by the numeral 10, is operable to receive an input signal 12. The analog input signal 12 is sampled to produce digital samples x(n). The analog input signal 12 is sampled at least at the Nyquist rate, which is equal to or greater than two times the highest frequency component of an analog signal. In this embodiment the minimum sampling frequency is actually 4 times the highest frequency In order to determine the energy in an input signal 12 at a given frequency, or bin frequency, the input signal 12 is multiplied by a waveform of the given frequency and integrated over time. In order to determine the energy of the input signal, the input signal must be correlated with a waveform of the same frequency and at the same phase. For example, two signals with the same frequency but 90 degrees out of phase will correlate to zero. Because the phase angle of the input is unknown, the input signal should be processed in order to remove the phase ambiguity. Generally, in order to calculate the energy of an input signal wherein the phase angle contribution is eliminated, the input signal is first correlated with a set of orthogonal waveforms, then these values are squared, and then the square root of the sum of these squared contributions is taken. The set of orthogonal waveforms are preferably sine and cosine waveforms.

Thus, the samples x(n) of the input signal 12 are multiplied by cos(wn) and sin(wn) by multiply functionality 14 and 24, respectively. As discussed below, these multiply functionalities 14 and 24 do not require a hardware multiply function, only hardware operable to perform addition and subtraction. The quadrature component 24, denoted as Q, is the sum of the products of x(n) and sin (wn). The in-phase component 16, denoted as I, is the sum of the products of x(n) and cos (wn). Next, the quadrature and in-phase components 24 and 16, respectively, must be integrated which can be done in the digital domain by a summation. The quadrature and in-phase components (24 and 16) are integrated by the integration functionalities 26 and 18, respectively. As discussed below, the integration functionalities 18 and 26 will not require hardware operable to perform integration operations because these operations may be performed by hardware suitable to perform add, subtract and ignore operations. Once the frame of data is integrated, the integrated I and Q components (16, 24) are squared by squaring functionalities 28 and 20, respectively. The squared components are then added together by summing functionality 30 to determine the energy 32 of the input signal 12 within that frequency bin. The summing functionality 30 may be any hardware suitable to perform add, subtract and ignore operations. As discussed below, the square root of the resulting sum need not be taken for the present application.

In order to create an accurate spectrum of an input signal, several frequencies must be considered. Because according to this exemplary embodiment of the present invention the frequency depends on the sampling rate, the Fourier analysis is concerned with relative frequencies or frequency bins. For example, the resulting frequencies which are analyzed have a given ratio to the sampling frequency, such as one half the sampling frequency, one quarter the sampling frequency, one eighth the sampling frequency, and one sixteenth the sampling frequency. For a spectrum analyzer the energy of these frequency bins must be calculated. Selected symmetries may be exploited to avoid the need for hardware multiply functions in calculating the energy of the frequency bins.

Figure 2:
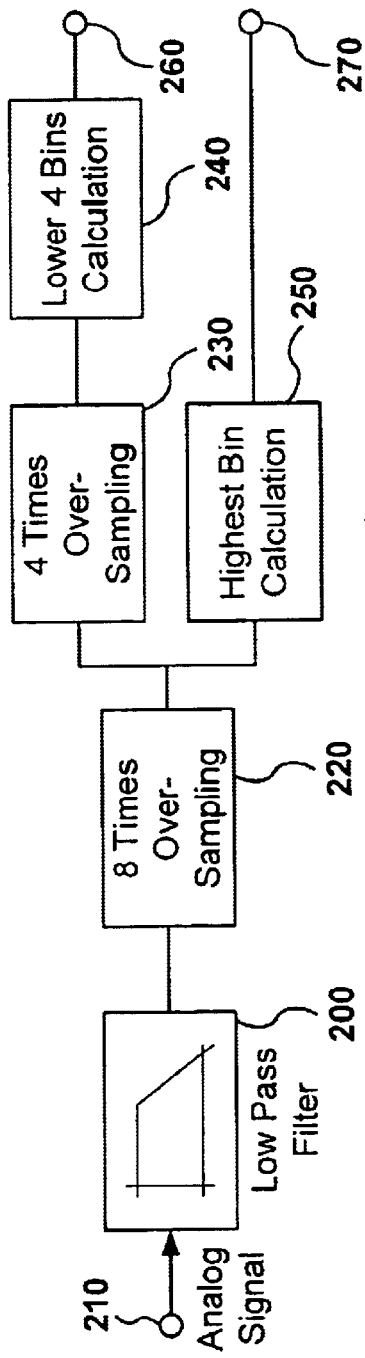
FIG. 2 is a block diagram of an exemplary embodiment of the present invention.
Figure 3:
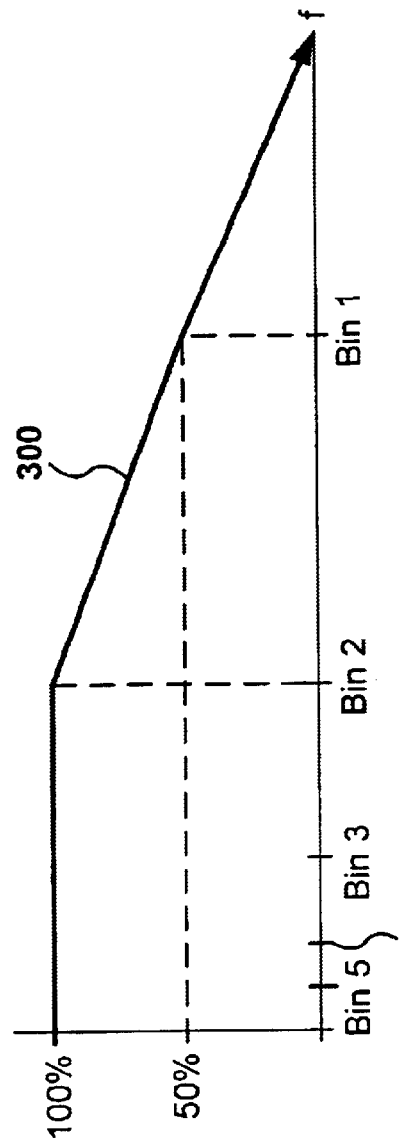
FIG. 3, is a graph showing the frequency response of the low pass filter according to FIG. 2.

FIG. 2 shows a block diagram according to one embodiment of the present invention. This embodiment can be realized with a simple microcontroller, such as an eight bit microcontroller. An analog signal can be accessed at terminal 210 from where it is fed to a low pass filter 200. The low pass filter is necessary to avoid any aliasing problems by cutting off high frequency portions of the analog signal. Furthermore, a specific characteristic of the low pass filter is used as will be explained below. The filtered signal is passed to an analog-digital-converter 220 (ADC). The ADC 220 performs an analog to digital conversion which samples the analog signal 8 times a first frequency which from now on will be referred to as an 8 time oversampling. This sampled signal is used basically in two paths of a following calculations. In a first path only every other sample is used and further processed. This is done in unit 230 by simply discarding every other sample. This 4-times oversampled signal is used to calculate the energy of the lower frequency bins in calculation unit 240, for example four frequency bins 2, 3, 4, and 5. The original 8 times oversampled signal is passed to calculation unit 250 to calculate one more frequency bin which is the highest frequency bin 1. The resulting energy levels can be accessed at terminals 260 and 270. As the highest frequency bin 1 will be calculated with twice as many samples, the resulting energy level at terminal 270 would be twice as high in comparison to the energy levels at terminal 260. Therefore, the present invention takes advantage of the low which has to be used for anti-aliasing purposes. FIG. 3 shows the frequency response of the anti-aliasing filter 200 in comparison with the frequency bins used by the analyzer. The cut-off point is designed to match the frequency of the second frequency bin. Thus the filter will have no influence on the lower four frequency bins 2, 3, 4, and 5. However, the filter uses a slope 300 which reaches an attenuation level of 6 dB at twice the frequency of the frequency bin 2. Thus, frequency bin 1 will be attenuated by 50% which compensates the fact that twice as many samples are used for this bin. The cut-off point can be anywhere between the bin 2 frequency and the bin 1 frequency. However, it is important that the 6 dB point matches the bin 1 frequency.

The digital input signal may be correlated with a digital sine or cosine waveform rather than an analog or continuous sine or cosine waveform. Therefore, it is not necessary to determine the value for a continuous sine or cosine waveform at any given time. Instead, discrete points for the digital sine and cosine waveforms may be selected. Because the input signal is being sampled at four times per cycle, the values of selected discrete points on the digital sin(wn) and cos (wn) functions will always equal either 1, 0 or −1. The values for sin(wn) and cos(wn) are shown in Table 1.

TABLE I

| Sample | I cos (wn) | Q sin (wn) |
|--------|------------|------------|
| 1 | 1 | 0 |
| 2 | 0 | 1 |
| 3 | −1 | 0 |
| 4 | 0 | −1 |
| 5 | 1 | 0 |
| 6 | 0 | 1 |
| 7 | −1 | 0 |
| 8 | 0 | −1 |
| . | . | . |
| . | . | . |
| . | . | . |

As discussed above, the Q component is the sum of the products of x(n), the samples of the input signal, and sin(wn). The I component is the sum of the products of x(n) and cos(wn). However, as shown above in Table I, if the input signal is sampled at twice the Nyquist rate, the values for the cos(wn) and sin(wn) alternate between 1, 0 and −1. Accordingly, the integration and multiplication of the I and Q components are equivalent to an add, subtract or ignore of the sampled input signals x(n). For instance, if cos(wn) or sin(wn) equals 1, the value for the sample x(n) may be simply added to the previous correlation value. If cos(wn) or sin(wn) equals −1, the value for the sample x(n) may be simply subtracted from the previous correlation value. If cos(wn) or sin(wn) equals zero, the incoming sample x(n) may be ignored. As a result, the multiplication functionalities 14 and 22 may be accomplished by hardware operable to perform only add, ignore and subtract operations. For example, using the values from Table I, samples x(1), x(5), and so on, are added to the I component sum, while samples x(3), x(7), and so on, are subtracted from the I component sum. Because these samples do not have a Q component, these samples do not contribute to the Q component sum. Likewise, samples x(2), x(6), and so on, are added to the Q component sum, while samples x(4), x(8), and so on, are subtracted from the Q component sum. Because summation in the digital domain corresponds to integration in the analog domain, the integration functionalities 18 and 26 may also be accomplished by hardware operable to perform only add, ignore and subtract operations. For example, a counter can be used. Each time a sample is taken the counter increments. The two least significant bits (LSB) can be used to lookup the required function. If the two LSBs are equal to 0, the sample is added to the Q component, if the two LSBs equal 1, the sample is added to the I component, if the two LSBs equal 2, the sample is subtracted from the Q component and if the two LSBs equal 3, the sample is subtracted from the I component. As a result, a simple state machine or counter may determine how to process the signal. Therefore, the I and Q components are determined by summing, subtracting or ignoring the appropriate samples x(n).

At this time, the sample values are not further needed. Thus, no storage area for intermediately storing the sample values is needed. Once a frame of data is integrated, the I and Q components are both squared. Accordingly, the only multiply required for this bin is the squaring multiply 20 and 28. The squaring multiply function need only be performed once the frame has been completed. Thus, the present system and method significantly reduces the number of multiply operations performed during the correlation process. For example, assume that a frame consists of 128 samples. Because the sample must be multiplied by a sine and cosine waveform, 256 multiplication operations would be required during the correlation phase. In addition, the squaring operation performed on the I and Q components would result in two more multiplication operations. However, the system and method of the present invention does not require multiplication operations during the correlation phase. Thus, if applied to this example, the 256 multiplication operations would be replaced by add, ignore and subtract operations. Thus, for the present invention, only the two squaring multiply operations must be performed for each frame.

Generally, multiply operations are preferably performed by hardware rather than software for performance reasons. For example, hardware multiply operations are faster than software multiply operations. However, because the squaring multiply is only performed twice per frame, this function may be performed by software rather than hardware without significantly reducing performance. The frame, which corresponds to the number of samples or the amount of time over which a signal is correlated, may be determined by the user based on various parameters or requirements, including the desired behavior of the spectrum analyzer. As discussed below, the correlation time has an effect on the size and shape of the frequency bins.

Typically, the square root of the sum of the squares of the I and Q components is taken in order to determine the energy of the input signal. This is a relatively complex function for a simple processor and only serves to force a non-linear scale. A spectrum analyzer displays the magnitude or energy level of one frequency bin relative to another. Therefore, these levels can be scaled to obtain the same result without the need for the square root operation. Because an additional square root operation serves only to scale the magnitudes of the energy levels, this operation does not add any additional information that is relevant to the output of a spectrum analyzer. As a result, the square root operation may be eliminated. Therefore, the squared I and Q components are summed to determine the energy in the first bin.

As discussed above, it is necessary to calculate the energy of several frequencies in order to produce an accurate spectrum of an input signal, such as an audio signal. Generally, human hearing differentiates frequencies based on a log scale rather than a linear scale. Therefore, a spectrum analyzer that is designed to be representative of the human perception of audio signals should be based on a log scale. Thus, an audio spectrum analyzer should space the frequency bins logarithmically rather than linearly. Therefore, the presently disclosed exemplary embodiment is well suited for audio spectrum analysis in addition to having simple processing requirements.

Figure 5:
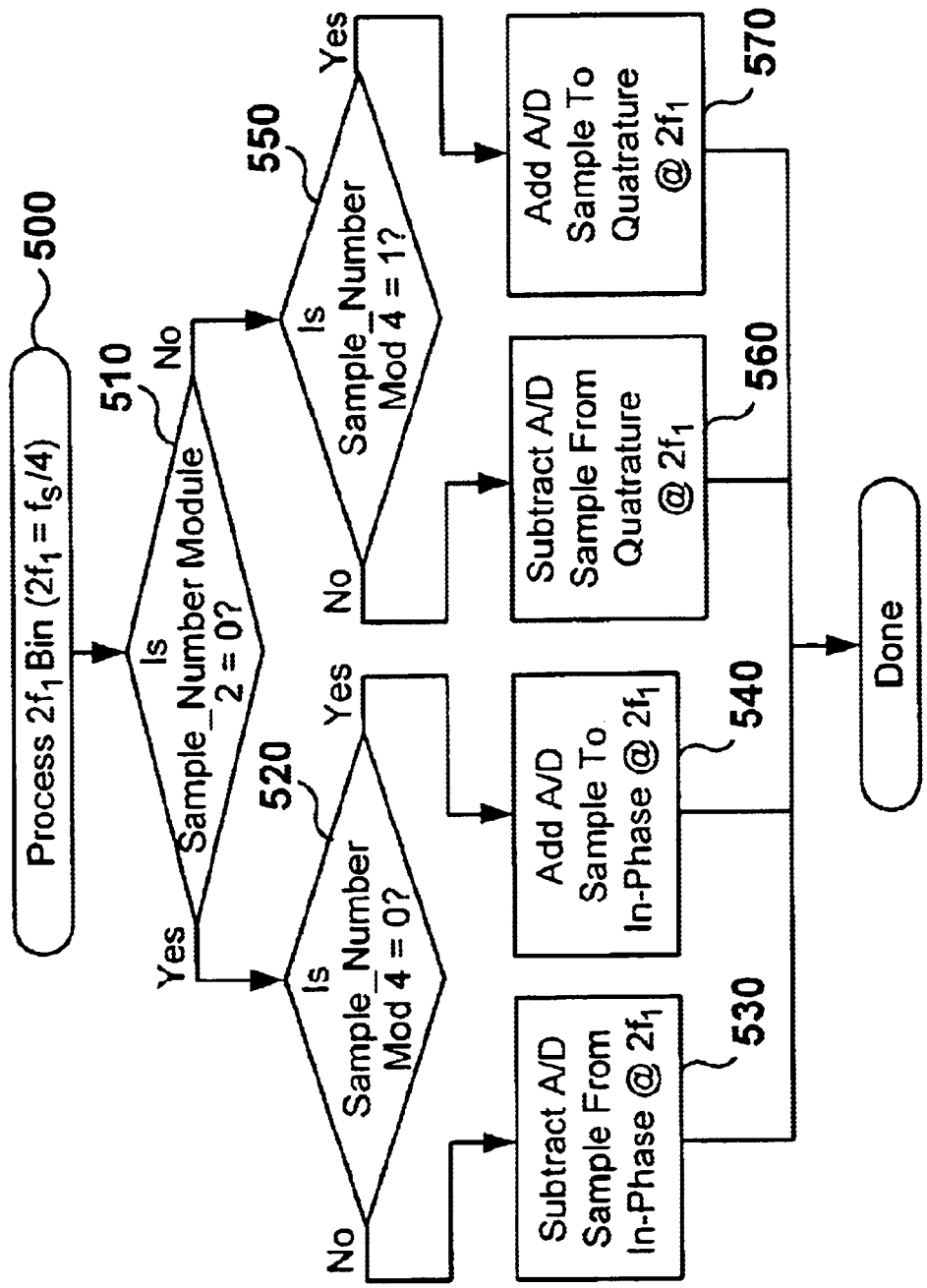

The frequency bin calculated above is one-half the highest frequency bin in the spectrum. The frequency $F_3$ of the next bin that is calculated is one-fourth that of the highest frequency $F_1=2F_2=4F_3$. For example, if the first bin was 2 KHz, then the second bin will be 1 KHz. FIG. 5 is a flow chart illustrating a process of calculating the energy corresponding to the third, fourth, and fifth frequency bins in the spectrum. The input signal is sampled at $4F_2$, as with bin 2. Because the sampling rate is defined by the highest frequency bin in the spectrum, samples for the third bin may be multiplied by factors that are not either 1 or −1. Table II shows the values for sin(wn) and cos(wn) for the second bin, and accordingly, the factors by which the input samples will be multiplied. It is unnecessary to utilize a routine that calculates the values for sin(wn) and cos(wn) because selected points with constant values may be used. Because the sine and cosine functions do not need to be coded, a lookup table holding the values for the specific points may be used instead.

TABLE II

| Sample | I cos (wn) | Q sin (wn) |
|---|---|---|
| 1 | 1 | 0 |
| 2 | cos (π/4) | sin(π/4) |
| 3 | 0 | 1 |
| 4 | cos(3π/4) | sin (3π/4) |
| 5 | −1 | 0 |
| 6 | cos(5π/4) | sin(5π/4) |
| 7 | 0 | −1 |
| 8 | cos(7π/4) | sin(7π/4) |
| 9 | 1 | 0 |
| 10 | cos(π/4) | sin(π/4) |
| 11 | 0 | 1 |
| 12 | cos(3π/4) | sin(3π/4) |
| 13 | −1 | 0 |
| 14 | cos(5π/4) | sin(5π/4) |
| 15 | 0 | −1 |
| 16 | cos(7π/4) | sin(7π14) |
| . | . | . |
| . | . | . |
| . | . | . |

Table II may be simplified by exploiting symmetries in the sine and cosine functions. Equations (1) and (2) below illustrate these symmetries.

$$\cos(\pi/4)=-\cos(3\pi/4)=-\cos(5\pi/4)=\cos(7\pi/4) \quad \text{Equation (1)}$$

$$\sin(\pi/4)=\sin(3\pi/4)=-\sin(5\pi/4)=-\sin(7\pi/4) \quad \text{Equation (2)}$$

The full scale samples are summed to form a partial I component, $I_f$ and a partial Q component, $Q_f$. The full scale samples are those even samples that are multiplied by 1 or −1, as illustrated in Table II. As discussed above, these full scale samples are pure I components or Q components. Accordingly, based on Table II, the partial I and Q components, $I_f$ and $Q_f$, may be expressed as:

$$Q_f=x(3)-x(7)+x(11)-x(15)+ \quad \text{Equation (3)}$$

$$I_f=x(1)-x(5)+x(9)-x(13)+ \quad \text{Equation (4)}$$

However, Table II shows that the even samples are mixed rather than full-scale samples, i.e., these even samples have both I and Q components. The contribution of these mixed samples must be determined in order to provide a complete value for the I and Q components. For example, using the values from Table II, sample x(2) is scaled by cos (π/4) to determine its contribution to the I component, and is scaled by sin(π/4) to determine its contribution to the Q component. However, because of the distributive property, the multiplication of the scaling factors with the mixed or even samples may be delayed until the end of the frame, after the mixed samples have been summed. Therefore, the mixed or even samples are summed separately from the full scale samples to form the sum M. Based on the values from Table III, M may be expressed as:

$$M=x(2)+x(4)+x(6)+ \quad \text{Equation (5)}$$

We therefore have several separate sums: (i) $Q_f$, a sum of the samples that have only Q components, as shown in Equation (3); (ii) $I_f$, a sum of the samples that have only I components, as shown in Equation (4); and (iii) M, the sum of the samples that have both I components and Q components that have not yet been scaled, as shown in Equation (5). The remaining half of the I component and Q component may be determined by multiplying M by the respective scaling factors. Using the symmetries shown in Equations (1) and (2), the scaling factors may be simplified to $\cos(\pi/4)$ and $\sin(\pi/4)$ for the quadrature and in-phase components, respectively. Accordingly, $I_m$ and $Q_m$, the partial sums of the I and Q components based on the contributions from the even or mixed samples x(n), may be expressed as follows:

$$Q_m = \sin(\pi/4) (M) \quad \text{Equation (6)}$$

$$I_m = \cos(\pi/4) (M) \quad \text{Equation (7)}$$

Thus, the sum M is multiplied by both the $\cos(\pi/4)$ factor and the $\sin(\pi/4)$ factor, to determine the contribution of the even samples to the Q and I components, respectively, at the end of the frame. Thus, by calculating several sums, multiplication operations may be avoided until the end of the frame. By accumulating the samples and delaying the multiplication operations until the entire frame is complete, the scaling of each even sample is not required. As discussed above, this allows the multiplication operation to be performed by software rather than hardware without a significant loss in performance.

The full-scale sample accumulations are added to the appropriately scaled sums of those samples with both I and Q components. Accordingly, at the end of the frame, the sample accumulations for the even quadrature samples that have been multiplied or scaled by $\cos(\pi/4)$ are added to the full scale quadrature samples. The sample accumulations for the even in-phase samples that have been multiplied by $\sin(\pi/4)$ are added to the full scale in-phase samples. Therefore, the I and Q components may be expressed as:

$$I = I_f + I_m \quad \text{Equation (8)}$$

$$Q = Q_f + Q_m \quad \text{Equation (9)}$$

The sum of all the in-phase samples are then squared and added to the square of the sum of all the quadrature samples. This final sum is the energy for the third bin 3. As discussed above, the two squaring operations may be performed by software instead of hardware.

The frequency of the fourth bin 4 is one-eight of the highest frequency. Again, the sampling frequency is defined by the highest frequency. With each step down in frequency, the complexity of the processing is increased. The scaling factors required for each sample in this fourth bin is illustrated in Table III below.

TABLE III

| Sample | I cos (wn) | Q sin (wn) |
|---|---|---|
| 1 | 1 | 0 |
| 2 | cos (π/8) | sin(π/8) |
| 3 | cos(π/4) | sin (π/4) |
| 4 | cos(3π/8) | sin (3π/8) |
| 5 | 0 | 1 |
| 6 | cos(5π/8) | sin(5π/8) |
| 7 | cos(3π/4) | sin(3π/4) |
| 8 | cos(7π/8) | sin(7π/8) |
| 9 | −1 | 0 |
| 10 | cos(9π/8) | sin(9π/8) |
| 11 | cos(5π/4) | sin(5π/4) |
| 12 | cos(11π/8) | sin(11π/8) |
| 13 | 0 | −1 |

TABLE III-continued

| Sample | I cos (wn) | Q sin (wn) |
|---|---|---|
| 14 | cos(13π/8) | sin(13π/8) |
| 15 | cos(7π/8) | sin(7π/8) |
| 16 | cos(15π/8) | sin(15π/8) |
| . | . | . |
| . | . | . |
| . | . | . |

The number of scaling factors and accumulation bins that must be maintained for this bin may reduced by exploiting selected symmetries in the sine and cosine functions. Equations (10) through (13) below illustrate these symmetries.

$$\cos(\pi/8) = -\cos(7\pi/8) = -\cos(9\pi/8) = \cos(15\pi/8) \quad \text{Equation (10)}$$

$$\cos(3\pi/8) = -\cos(5\pi/8) = -\cos(11\pi/8) = \cos(13\pi/8) \quad \text{Equation (11)}$$

$$\sin(\pi/8) = \sin(7\pi/8) = -\sin(9\pi/8) = -\sin(15\pi/8) \quad \text{Equation (12)}$$

$$\sin(3\pi/8) = \sin(5\pi/8) = -\sin(11\pi/8) = -\sin(13\pi/8) \quad \text{Equation (13)}$$

As discussed above, these symmetries may be exploited in order to provide a simpler lookup table of scaling factors. Once again, all multiplication operations are delayed until the end of the frame. Accumulations for the in-phase component consist of the full scale component, the $\sin(\pi/8)$ component, the $\sin(\pi/4)$ component and the $\sin(\pi/8)$ component. Likewise, the accumulations for the quadrature component consists of the full scale component, the $\cos(\pi/8)$ component, the $\cos(\pi/4)$ component, and the $\cos(3\pi/8)$ component. At the end of the frame, the sums for the scaled samples must be multiplied by the appropriate factor and then added to the sum of the full scale samples. As with the previous bins, the resulting I and Q sums are then squared and added together to determine the energy for this bin. It can be seen from the above disclosure that, as the bin frequency decreases, the calculations necessary for determining the energy of the bin require more processing. The practical limit for most 8-it processors is typically one more step down to a fifth bin 5 corresponding to one-sixteenth the highest frequency. Beyond this point, the number of bins that must be maintained and the processing required at the end of the frame become too cumbersome for a simple processor. However, if the processor is capable more bins can be calculated according to the above procedure.

Figure 6:
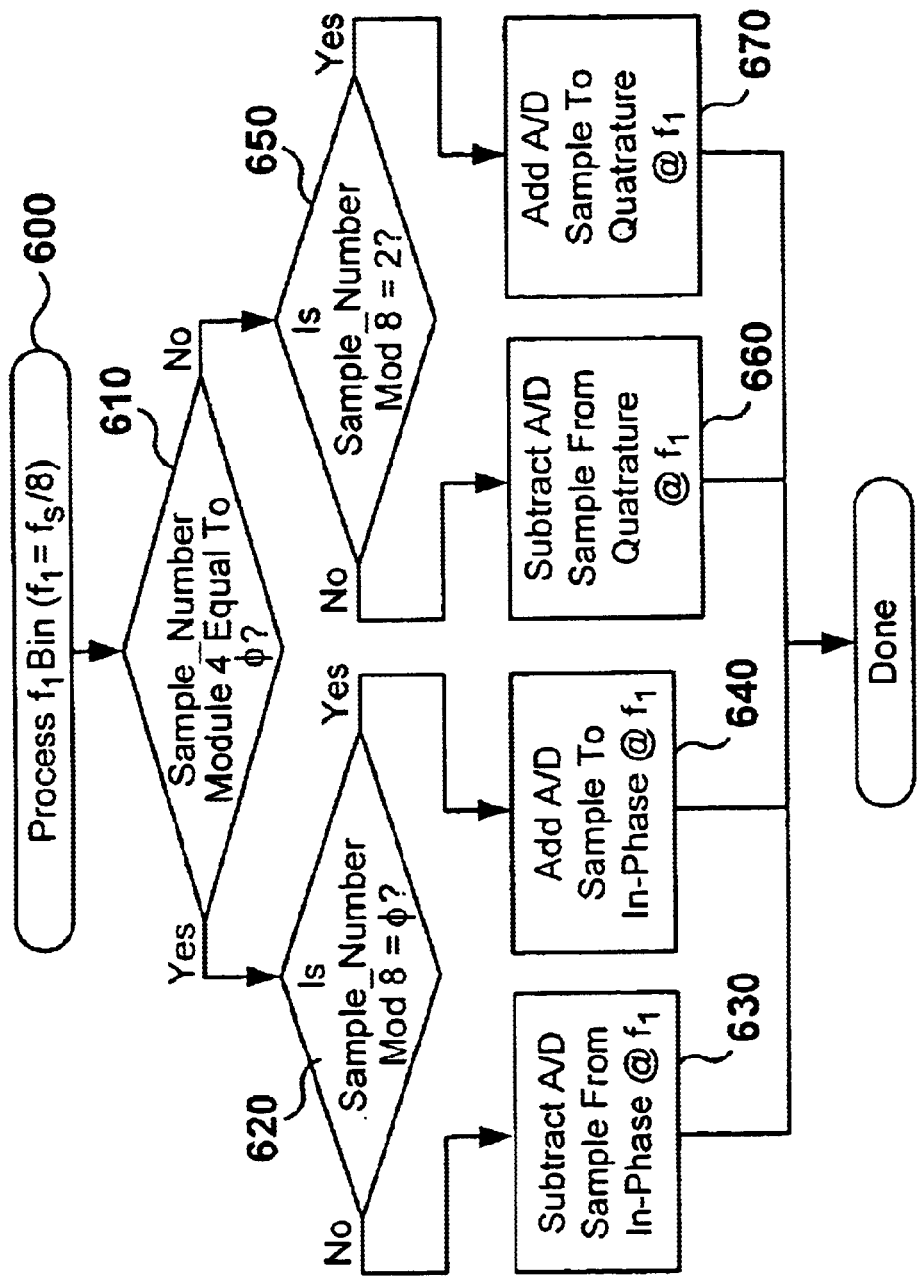

The first bin 1 is added in a manner that can be processed by a simple processor such as an 8-bit processor. As discussed below, this first bin 1 corresponds to the highest frequency, or twice the frequency of the second bin 2. FIG. 6 is a flow chart illustrating process of calculating the energy corresponding to the first frequency bin in the spectrum. First, the original 8-times over-sampled analog signal is used. For the four bins 2, 3, 4, and 5 discussed above, the input signal was sampled at four times the frequency of the first bin. However, for the first bin, the input signal is sampled at eight times the frequency $F_2$ of the second bin or four times the highest frequency $F_1$. Because this is twice the sampling rate for the four bins 2, 3, 4, and 5 discussed above, every other sample is disregarded for the first four bins. In order to calculate the energy for this first bin, the spectrum analyzer uses a low pass filter that attenuates the signal by 6 dB. Although attenuating the signal by 6 dB results in samples with half the voltage, by taking twice as many samples, the analyzer reaches the same result. This low pass filter serves as an anti-aliasing filter to prevent aliasing from affecting the lower frequency bins. As discussed above, the full-scale samples are separately summed. The complete I and Q sums are both squared and these two squared sums are added to produce the energy in bin 1.

Accordingly, bin 1 does not require complex processing. This brings the total number of bins for a spectrum analyzer that may be implemented in a simple processor to five. This is sufficient for audio spectrum analysis applications, because humans are generally not able to distinguish much more than the five frequency bands calculated by the algorithm of the present invention. For example, an audio spectrum analyzer may be implemented with the following five frequency bands: 250 Hz, 500 Hz, 1 KHz, 2 KHz, and 4 KHz.

The principle shown with the first bin 1 can be extended. Two parameters have to be adjusted to accomplish this. The next higher frequency would be $2F_1$. Therefore, the sampling frequency has to be doubled. In order to get results which are in the correct relation with the other bins 1–5 again the level of the this frequency bin has to be adjusted by means of the anti-aliasing filter. A further adjustment of 6 dB is necessary. Therefore, the filter design gets more complicated as the filter has to meet more specifications. However, if necessary such an implementation would be possible.

In order to extract or determine the energy between the frequencies that are being correlated, the sampling rate may be swept. Frequency sweeping involves changing the sampling rate in increments in order to determine the energy at frequencies between the bins. Thus, for every frame, the sampling frequency is changed slightly. For example, the frequencies for the first frame may be 250 Hz, 500 Hz, 1 KHz, 2 KHz, and 4 KHz. For the next frame, the sampling rate may be changed slightly so that the frequencies are now 300 Hz, 600 Hz, 1200 Hz, 2400 Hz, and 4800 Hz. Thus, sweeping expands the range of frequencies that will be analyzed. By sweeping the frequency and adding the components, a more complete range of frequencies may be correlated and taken into account. As a result, a more comprehensive spectral analysis may be produced. The 6 dB attenuation can be processed in Software instead of hardware in particular if sweeping changes the attenuation effect of the filter.

Figure 10:
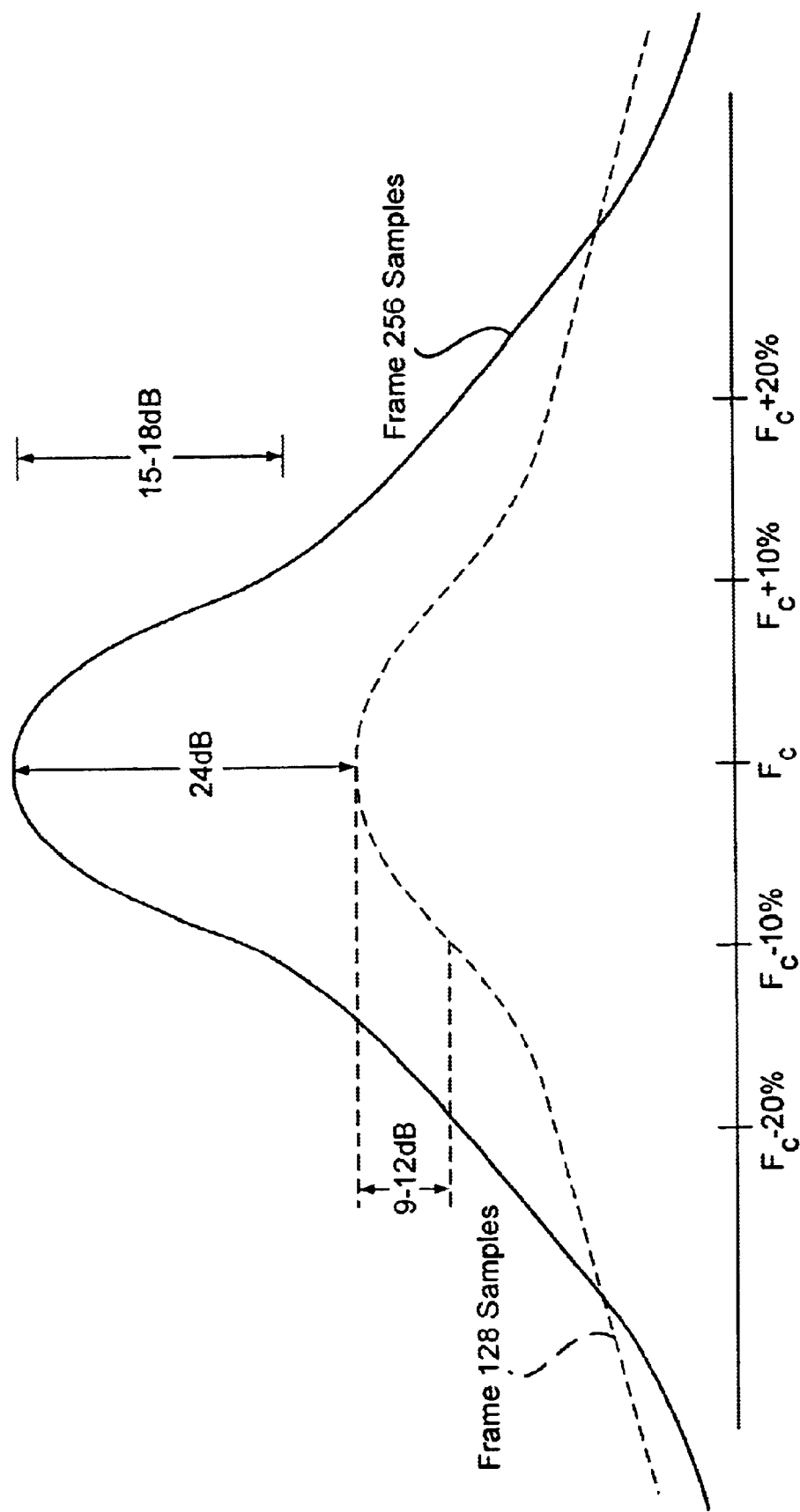
FIG. 10 is a diagram illustrating the relationship between correlation time and the maximum amplitude of the integrated energy.

Correlation time is a parameter that may be manipulated to change the shape and amplitude of the energy bins. As the correlation time is lowered, the rejection of frequencies that do not correlate exactly is also lowered. For example, the user of the spectrum analyzer may wish to determine the energy at 500 Hz for a 450 Hz signal. If the correlation period is too long, only information about the 500 Hz signal would be gathered and no information about the energy at 450 Hz would be determined. By correlating for fewer and fewer cycles, energy information about the 450 Hz frequency may be determined. Lowering the correlation time also has the effect of decreasing the maximum amplitude of the integrated energy. For example, FIG. 10 illustrates the effect of changing the number of samples in a frame. The number of samples in a frame corresponds to the correlation time. If a frame of data takes 256 samples, the exact frequency is greater than 50 dB above the noise. Any frequency that deviates more than 20% from the correlation frequency is considered noise. With 128 samples in the frame, signals within 10% of the correlation frequency are within 15 dB of the maximum amplitude. Data transmission applications require long correlation times and very tight, very tall bins to ensure the accuracy of the transmission and minimize noise. Data transmission applications may require exact correlation because the exact frequency intended for the transmission is the chief concern. On the other hand, for applications such as audio spectrum analysis where it is important to analyze a range of frequencies, it is desirable to have fairly broad, fairly flat bins.

FIGS. 4–9 are an exemplary embodiment in form of flow charts illustrating the process of calculating the spectral energies of different bins in more detail. The Routine starts in FIG. 4 at step 400 where an A/D sample is received. At step 410 the highest frequency bin 2 f1 is calculated. At step 420 it is decided whether the sample number is odd or even. if odd the routine branches to step 470. If not the calculation for bins f1, f1/2, f1/4, and f1/8 is performed in following steps 430, 440, 450, and 460. In step 470 the sample number is incremented. In step 480 it is evaluated whether the frame is complete. If no the routine is repeated until the condition is true. Then, in step 490, the bin energies are calculated and the sample number is reset.

Figure 4:
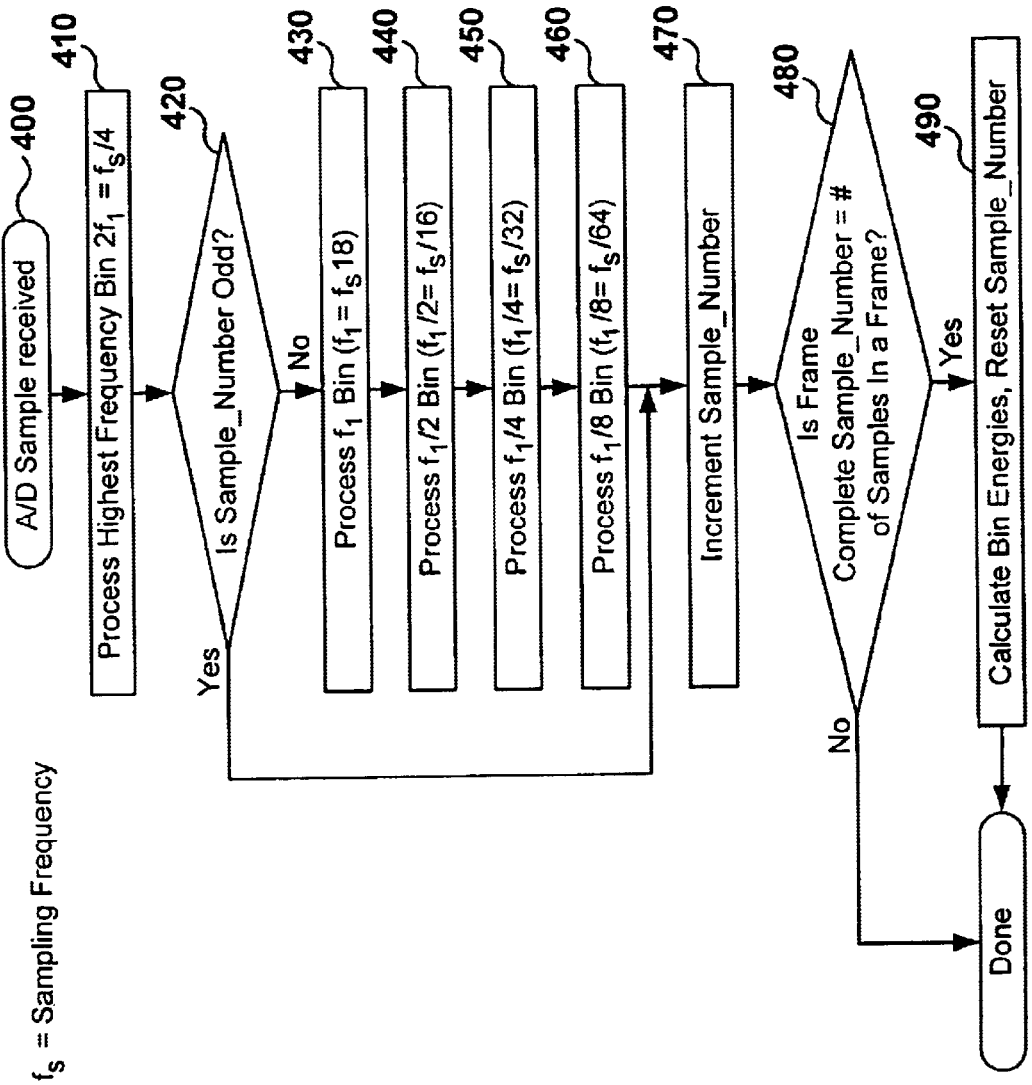
FIGS. 4, 5, 6, 7, 8 and 9 are flow diagrams illustrating other embodiments of the present invention.

FIG. 5 shows the subroutine 410 of FIG. 4 for calculating the highest bin for frequency 2f1. The routine starts with step 500. At step 510 it is decided whether the sample number modulo 2 equals 0. If yes then in step 520 it is decided whether the sample number modulo 4 equals 0. If not, then in step 530 the sample value is subtracted from the In-phase component at 2f1. If yes, then in step 540 the sample value is added to the In-phase component at 2f1. If the result in step 510 is no, then it is decided in step 550 whether the sample number modulo 4 equals 1. If not, then in step 560 the sample value is subtracted from the Quadrature component at 2f1. If yes, then in step 570 the sample value is added to the Quadrature component at 2f1.

FIG. 6 shows the subroutine 430 of FIG. 4 for calculating the second bin for frequency f1. The routine starts with step 600. At step 610 it is decided whether the sample number modulo 4 equals 0. If yes then in step 620 it is decided whether the sample number modulo 8 equals 0. If not, then in step 630 the sample value is subtracted from the In-phase component at f1. If yes, then in step 640 the sample value is added to the In-phase component at f1. If the result in step 610 is no, then it is decided in step 650 whether the sample number modulo 8 equals 2. If not, then in step 660 the sample value is subtracted from the Quadrature component at f1. If yes, then in step 670 the sample value is added to the Quadrature component at f1.

Figure 7:
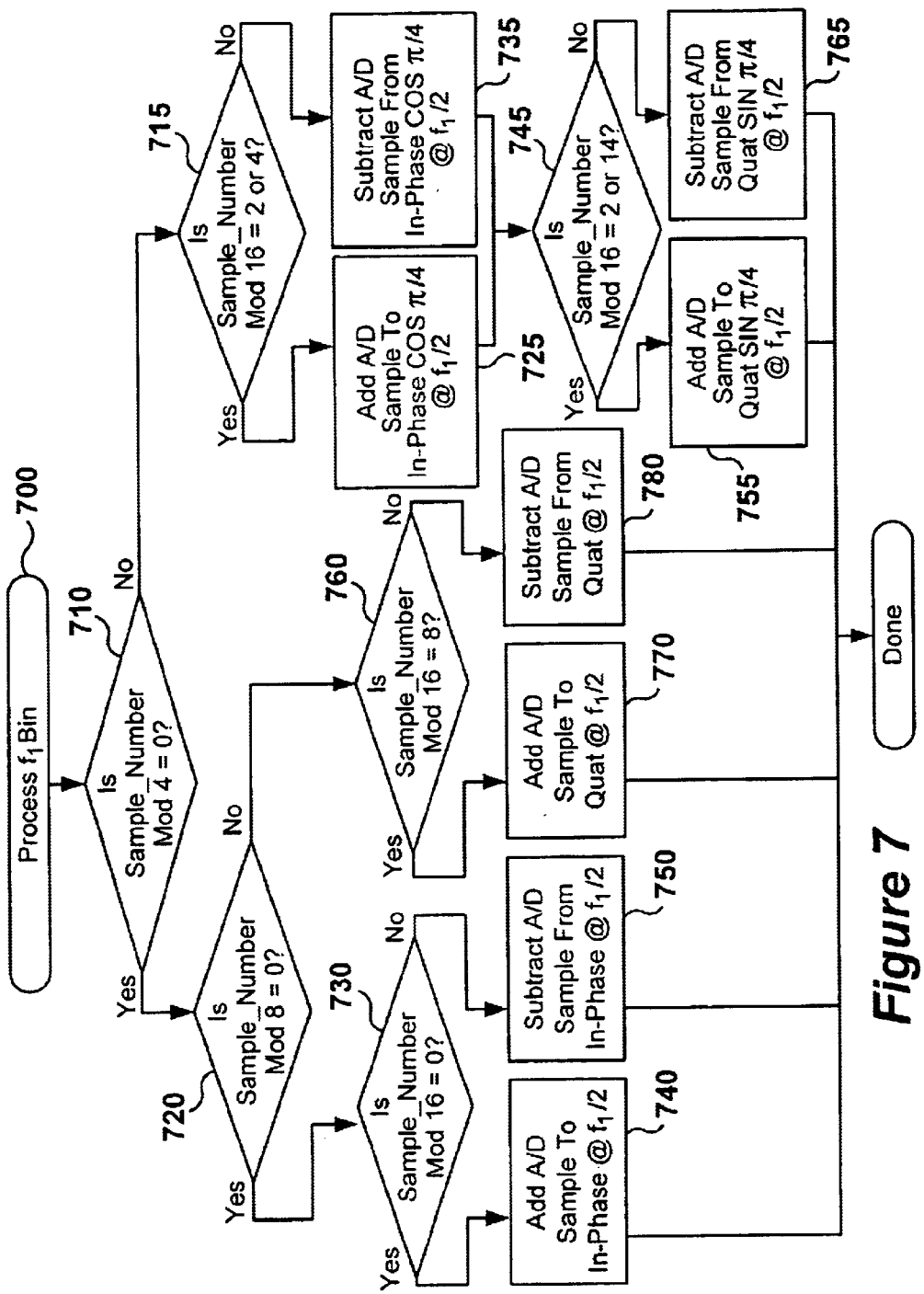

FIG. 7 shows the subroutine 440 of FIG. 4 for calculating the third bin for frequency f1/2. The routine starts with step 700. At step 710 it is decided whether the sample number modulo 4 equals 0. If yes then in step 720 it is decided whether the sample number modulo 8 equals 0. If yes then in step 730 it is decided whether the sample number modulo 16 equals 0. If not, then in step 750 the sample value is subtracted from the In-phase component at f1/2. If yes, then in step 740 the sample value is added to the In-phase component at f1/2. If the result in step 720 is no, then it is decided in step 760 whether the sample number modulo 16 equals 8. If not, then in step 780 the sample value is subtracted from the Quadrature component at f1/2. If yes, then in step 770 the sample value is added to the Quadrature component at f1/2. If the result in step 710 is no, then in step 715 it will be decided whether the sample number modulo 16 equals 2 or 4. If yes, then in step 725 the sample value is added to the In-phase cos $\pi/4$ component at f1/2. If not, then in step 735 the sample value is subtracted from the In-phase cos $\pi/4$ component at f1/2. The routine continues after step 725 or 735 at step 745 where it is decided whether the sample number modulo 16 is equal 2 or 14. If yes, then in step 755 the sample value is added to the Quadrature sin $\pi/4$ component at f1/2. If not, then in step 765 the sample value is subtracted from the Quadrature sin $\pi/4$ component at f1/2.

Figure 8:
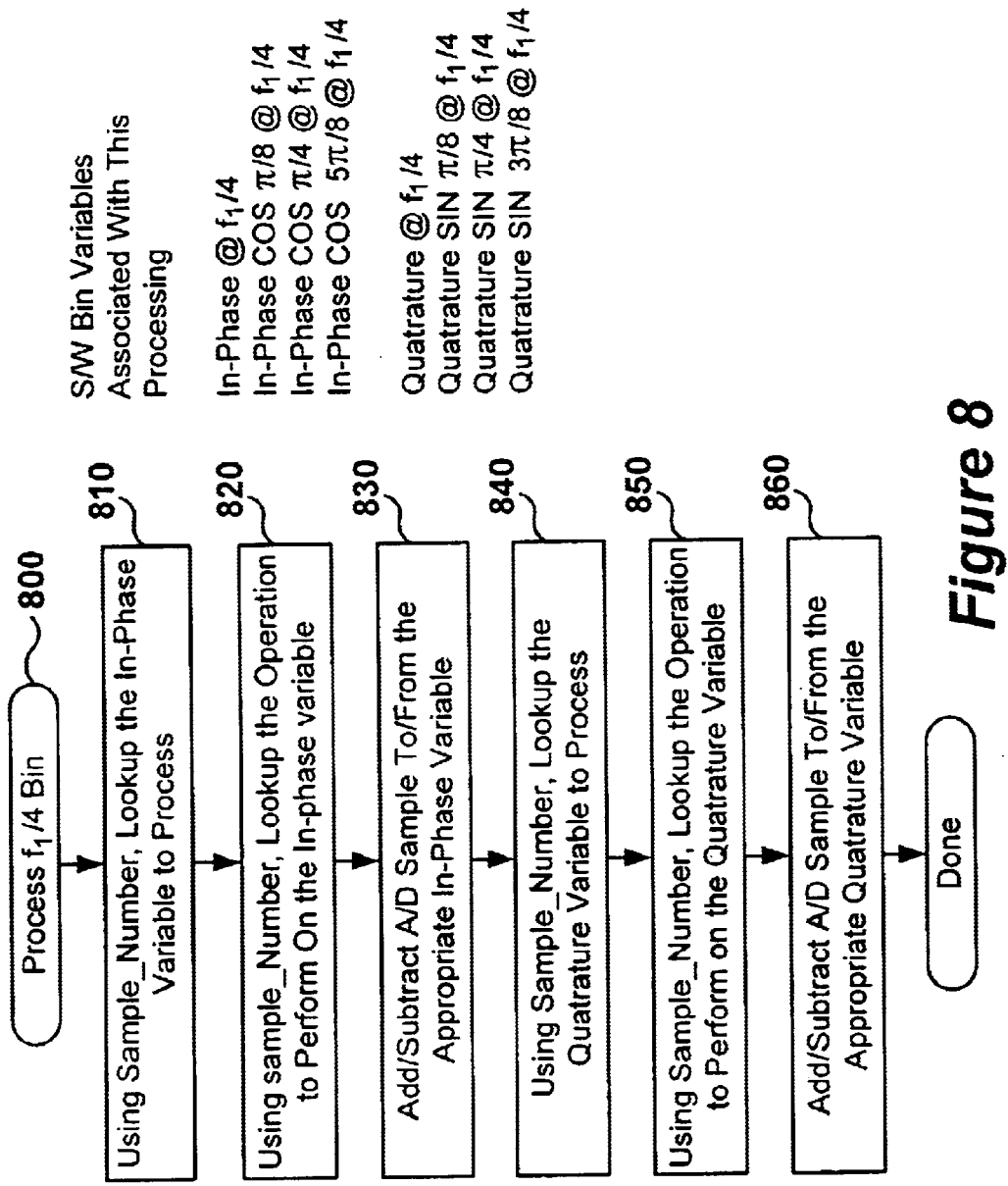

FIG. 8 shows the subroutine for processing the fourth bin at frequency f1/4. The routine starts at step 800. In step 810 the In-phase component to be processed is looked up using the sample number. In the following step 820, the operation to be performed on the In-phase component is looked up using the sample number. In the following step 830 the sample value is either added or subtracted to or from the appropriate In-phase component. In the next step 840 the Quadrature component to be processed is looked up using the sample number. In step 850, the operation to be performed on the Quadrature component is looked up using the sample number. In the following step 860 the sample value is either added or subtracted to or from the appropriate Quadrature component. Subroutine 460 of FIG. 4 is calculated in a respective way.

Figure 9:
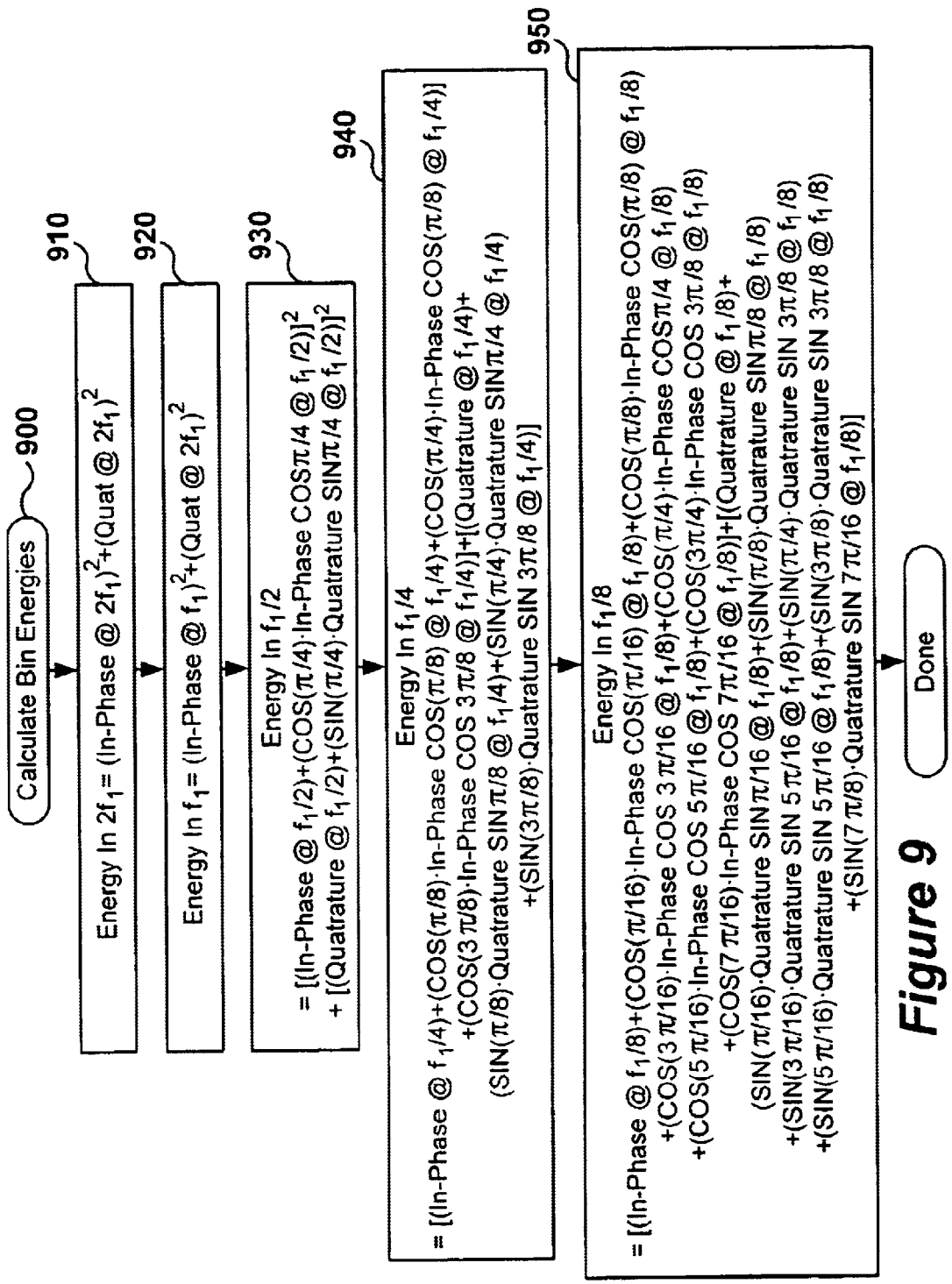

FIG. 9 shows a flow chart for the subroutine 490 of FIG. 4 calculating the bin energies. The routine starts at step 900. In steps 910 through 950 the energy of the 2f1, the f1, the f1/2, the f1/4, and the f1/8 bin are calculated according to the respective equations shown in FIG. 9.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method of performing a spectral analysis of an input signal comprising the steps of:
   sampling the input signal four times a first frequency f1;
   calculating the spectral energy at at least one frequency bin Fn, whereby Fn equals $1/(4n)f1$ and n being an integer>=1.

2. Method according to claim 1, further comprising the steps of:
   low pass filtering the input signal, whereby an attenuation of the input signal at a frequency f2=2f1 is achieved;
   sampling the input signal eight times of the first frequency f1;
   calculating the spectral energy at f2.

3. Method according to claim 2 wherein the sampling the input signal four times the first frequency f1 is achieved by discarding every other sample of the eight times sampling the input signal.

4. Method according to claim 1, wherein scaling factors of cos(wn) and sin(wn) components of the spectral energy are stored in a lookup table.

5. Method according to claim 4, wherein a separate summation of samples for each scaling factor is maintained.

6. Method according to claim 5, wherein the calculation of in-phase component and
   quadrature component of the sample is performed by multiplying a summation by the appropriate scaling factor; and
   summing the appropriate products of the summation of samples with the appropriate scaling factors.

7. Method according to claim 2, wherein the low pass filter attenuates the input signal by approximately 6 dB.

8. The method of claim 6, wherein the step of multiplying each summation by the appropriate scaling factor occurs at the end of a frame of data.

9. The method of claim 1, wherein the multiply operations are performed by a software agent.

10. A method for producing a frequency spectrum analysis for an input signal comprising the steps of:
    low pass filtering the input signal, whereby an attenuation of the input signal at a frequency f1 is achieved;
    sampling the input signal eight times of the first frequency f1/2;
    calculating the spectral energy at f1 for a first bin $F_1$;
    discarding every other sample and calculating the spectral energy at at least one frequency bin Fn, whereby Fn equals $1/(4(n-1))f1$ and n being an integer>=2.

11. Method according to claim 10 wherein the sampling the input signal four times the first frequency f1 is achieved by discarding every other sample of the eight times sampling the input signal.

12. Method according to claim 10, wherein scaling factors of cos(wn) and sin(wn) components of the spectral energy are stored in a lookup table.

13. Method according to claim 12, wherein a separate summation of samples for each scaling factor is maintained.

14. Method according to claim 13, wherein the calculation of in-phase component and quadrature component of the sample is performed by multiplying a summation by the
    appropriate scaling factor; and
    summing the appropriate products of the summation of samples with the appropriate scaling factors.

15. Method according to claim 10, wherein the low pass filter attenuates the input signal by approximately 6 dB.

16. The method of claim 14, wherein the step of multiplying each summation by the appropriate scaling factor occurs at the end of a frame of data.

17. The method of claim 10, wherein the multiply operations are performed by a software agent.

18. Digital audio spectrum analyzer for analyzing an analog input signal comprising:
    a low pass filter receiving the analog input signal and attenuating the input signal at a frequency f1 and generating an output signal;
    an analog-to-digital-converter receiving the output signal of the low pass filter and 8-times oversampling a frequency f2=f1/2;
    a sampling reducer generating a 4-times oversampled signal coupled with the analog-to-digital-converter;
    a first spectral energy calculation unit receiving the 4-times oversampled signal;
    a second spectral energy calculation unit receiving the 8-times oversampled signal.

19. Digital audio spectrum analyzer according to claim 18, wherein the low pass filter attenuates the input signal by approximately 6 dB at the frequency f1.

20. Digital audio spectrum analyzer according to claim 19, wherein the low pass filter comprises a cut-off frequency located between frequency f1 and frequency f2.

21. Digital audio spectrum analyzer according to claim 18, wherein the first spectral energy calculation unit calculates the spectrum at at least one frequency bin Fn, whereby Fn equals $1(4(n-1))f2$ and n being an integer>=2.

22. Digital audio spectrum analyzer according to claim 18, wherein the second spectral energy calculation unit calculates the spectrum at frequency f1.

* * * * *